United States Patent [19]
Narayanan

[11] Patent Number: 5,682,391
[45] Date of Patent: Oct. 28, 1997

[54] APPARATUS AND METHOD FOR HIGH SPEED SHIFTING OF TEST DATA THROUGH AN INTEGRATED CIRCUIT

[75] Inventor: Sridhar Narayanan, Sunnyvale, Calif.

[73] Assignee: Sun Microsystems, Inc., Mountain View, Calif.

[21] Appl. No.: 603,881

[22] Filed: Feb. 22, 1996

[51] Int. Cl.[6] ............................................. G01R 31/28
[52] U.S. Cl. ............................................. 371/22.3
[58] Field of Search ........................... 371/22.3, 22.5, 371/22.6, 21.1, 20.1; 327/202; 365/189.02, 189.01, 189.05, 189.12, 198, 200, 201, 230.05, 233

[56] References Cited

U.S. PATENT DOCUMENTS

| | | | |
|---|---|---|---|
| 5,198,999 | 3/1993 | Abe et al. | 365/189.05 |
| 5,281,864 | 1/1994 | Hahn et al. | 327/202 |
| 5,343,425 | 8/1994 | Saito et al. | 365/189.01 |
| 5,355,369 | 10/1994 | Greenbergerl et al. | 371/22.3 |

*Primary Examiner*—Hoa T. Nguyen
*Attorney, Agent, or Firm*—Flehr Hohbach Test Albritton & Herbert LLP; William S. Galliani

[57] ABSTRACT

High speed shifting of test data through an integrated circuit is achieved by modifying the output portion of a circuit, while still observing relevant test standard protocols, such as the Joint Test Access Group, IEEE Std. 1149.1, entitled IEEE Standard Test Access Port and Boundary-Scan architecture. An output signal generated during a first signal transition of a first clock cycle is passed through a large output multiplexer with a long path delay. A cycle-insertion switching element is connected to the output node of the output multiplexer. The cycle-insertion switching element generates an output signal in response to a first signal transition of a second clock cycle. An output switching element applies the output signal to an output pin in response to a second signal transition of the second clock cycle. A second multiplexer is used to select the output signal from either the output multiplexer or the cycle-insertion switching element. The output signal from the output multiplexer is selected at lower clock speeds when the signal delay through the output multiplexer is not critical. The output signal from the cycle-insertion switching element is selected at higher clock speeds to insure that the output switching element receives the output signal before the second signal transition of the additional clock cycle.

19 Claims, 5 Drawing Sheets

APPARATUS AND METHOD FOR HIGH SPEED SHIFTING OF TEST DATA THROUGH AN INTEGRATED CIRCUIT

BRIEF DESCRIPTION OF THE INVENTION

This invention relates generally to circuitry used to test integrated circuits. More particularly, this invention relates to a technique to improve the speed at which test data is shifted through an integrated circuit.

BACKGROUND OF THE INVENTION

The testing of integrated circuits commonly involves an operation of shifting test instructions and associated test data into an integrated circuit and subsequently analyzing the output generated by the integrated circuit. The Joint Test Access Group (JTAG) developed an integrated circuit and circuit board testing standard known as IEEE Std 1149.1, *IEEE Standard Test Access Port and Boundary-Scan Architecture*. This standard will be referred to herein as the JTAG standard.

The JTAG standard defines test logic that can be included in integrated circuits to provide standardized approaches to testing an integrated circuit, testing the interconnections between integrated circuits once they have been assembled onto a printed circuit board, and observing or modifying circuit activity during the circuit's normal operation.

FIG. 1 illustrates an integrated circuit 20 with device logic 22 and JTAG circuitry 24 formed therein. The integrated circuit 20 is positioned within a package housing 26, which includes a set of package pins 28. Most of the package pins 28 are used for data and control signals for the device logic 22. However, in accordance with the JTAG standard, a number of pins are designated for testing operations. Some of the pins required by the JTAG standard include a Test Data Input (TDI) pin 30, a Test Clock (TCK) pin 32, and a Test Data Output (TDO) pin 34, which are illustrated in FIG. 1.

The TDI, TCK, and TDO pins are electrically connected to the JTAG circuitry 24. The JTAG circuitry includes a Test Access Port (TAP) controller 40, which generates the control signals for the JTAG circuitry 24. The JTAG circuitry 24 also includes a TAP register block 42, which generally refers to all of the registers used in accordance with the JTAG standard. These registers are distributed over the semiconductor 22. Finally, the JTAG circuitry 24 includes a TAP output circuit 44, which controls the serial output signals generated by the JTAG circuitry.

The present invention is directed toward improving existing TAP output circuit 44 architectures. FIG. 2 illustrates a typical TAP output circuit 44. The TAP output circuit 44 includes a TAP output multiplexer 46, which is connected to all of the registers within the TAP register block 42. By way of example, the TAP register block 42 is shown to include an instruction register 50, a boundary scan register 52, a device identification register 54, a set of test data registers 56A-56N, and a bypass register 58. The operation of these registers is controlled by the TAP controller 40. That is, the TAP controller 40 executes known circuit testing operations in conjunction with the individual registers of the TAP register block 42.

The output signals generated during the course of the testing operations are conveyed to the TAP output circuit 44. In particular, the TAP controller 40 generates selection signals that are applied to the TAP output multiplexer 46 so that the output of a single register is serially passed through the multiplexer 46. After passing through the multiplexer 46, the individual signals are latched through an output switching element referred to as a TDO flip-flop 60. The output of the TDO flip-flop 60 is applied to the TDO pin 34.

The JTAG standard stipulates that the TDO flip-flop 60 be clocked with the negative edge of the TCK signal. This rule is necessary to insure that a half-cycle of the clock signal exists to pass output data to another integrated circuit positioned on the same or another circuit board. By requiring that the TDO flip-flop 60 be clocked with the negative edge of the TCK signal, the signal to be processed by the TDO flip-flop 60 must pass through the TAP output multiplexer 46 within a half-cycle of the clock signal. The TAP output multiplexer 46 is connected to a large number of registers. Thus, it is commonly implemented as a tree of multiplexers, which has a relatively long path delay. Consequently, this half-cycle requirement can place a constraint on high-speed shifting of data. FIG. 3 illustrates the problem. FIG. 3 illustrates a flip-flop 62. The flip-flop 62, by way of example, is the terminal switching component (last flip-flop) of the boundary scan register 62, as shown in FIG. 2. FIG. 3 also illustrates the TAP output multiplexer 46 and the TDO flip-flop 60.

FIG. 3 also illustrates a set of waveforms. In particular, the figure illustrates the clock signal TCK used to control the flip-flops 62 and 60. Waveform 70 illustrates the D1 node of flip-flop 62 transitioning from low to high. The Q1 node of the flip-flop 62 outputs the high value at the next positive signal transition of the clock. Waveform 72 illustrates this operation occurring at time T1. (The operation actually occurs slightly after time T1 due to a small delay known as the "clock-to-Q" delay. Similar delays at the Q output nodes are shown in the remaining figures.)

The signal transition of waveform 72 must pass through the TAP output multiplexer 46 within a half-cycle ending at time T2. In other words, the signal transition of waveform 72 must reach the TDO_D node of TDO flip-flop 60 by time T2. Waveform 74 illustrates a signal transition from low to high before time T2. That is, TDO D is at a high value before time T2. Thus, at the negative signal transition of the TCK signal at time T2, the high value can be driven to output node TDO_Q, as shown with waveform 76.

On the other hand, if the transition to the high signal is delayed through the TAP output multiplexer 46 and the TDO D node does not receive a high value by time T2, as shown with waveform 78, then at time T2 an erroneous low signal will be passed to the TDO_Q output node, as shown with waveform 80.

This problem can be further appreciated with reference to an existing circuit. In the UltraSparc™ microprocessor sold by Sun Microsystems, Inc., Mountain View, California, the TAP output multiplexer 46 includes output paths with three 2 to 1 multiplexers. When the chip is operating at 167 MHz, the data must propagate through the three 2 to 1 multiplexers in 3 nano-seconds. Thus, the TAP output multiplexer 46 is a critical path that limits the speed at which the internal scan chain can be shifted. This problem becomes more pronounced with increasing clock frequencies and larger multiplexers to accommodate additional shift registers used for more comprehensive testing. In addition, it is frequently desirable to perform testing operations at clock speeds that are equal to the actual clock speed at which the functional circuit (e.g., device logic 22 in FIG. 1) will operate. Higher clock speeds translate to increased test data rates, leading to lower test application times, and higher test efficiency.

In view of the foregoing, it would be highly desirable to provide a method and apparatus to facilitate increased clock speeds for integrated circuit testing operations. Of course, the new technique must be fully compliant with JTAG standards.

SUMMARY OF THE INVENTION

The invention is a technique to achieve high speed shifting of test data through an integrated circuit by modifying the output portion of a circuit, while still observing relevant test standard protocols, such as the Joint Test Access Group, IEEE Std. 1149.1, entitled IEEE Standard Test Access Port and Boundary-Scan Architecture. An output signal generated during a first signal transition of a first clock cycle is passed through a large output multiplexer with a long path delay. A cycle-insertion switching element is connected to the output node of the output multiplexer. The cycle-insertion switching element generates an output signal in response to a first signal transition of a second clock cycle. An output switching element applies the output signal to an output pin in response to a second signal transition of the second clock cycle. A second multiplexer is used to select the output signal from either the output multiplexer or the cycle-insertion switching element. The output signal from the output multiplexer is selected at lower clock speeds when the signal delay through the output multiplexer is not critical. The output signal from the cycle-insertion switching element is selected at higher clock speeds to insure that the output switching element receives the output signal before the second signal transition of the additional clock cycle.

The technique of the invention facilitates high speed testing of integrated circuits. Thus, the invention provides improved test data rates, lower test application times, and overall increased testing efficiency. The technique of the invention achieves these benefits while remaining fully compliant with JTAG standards.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
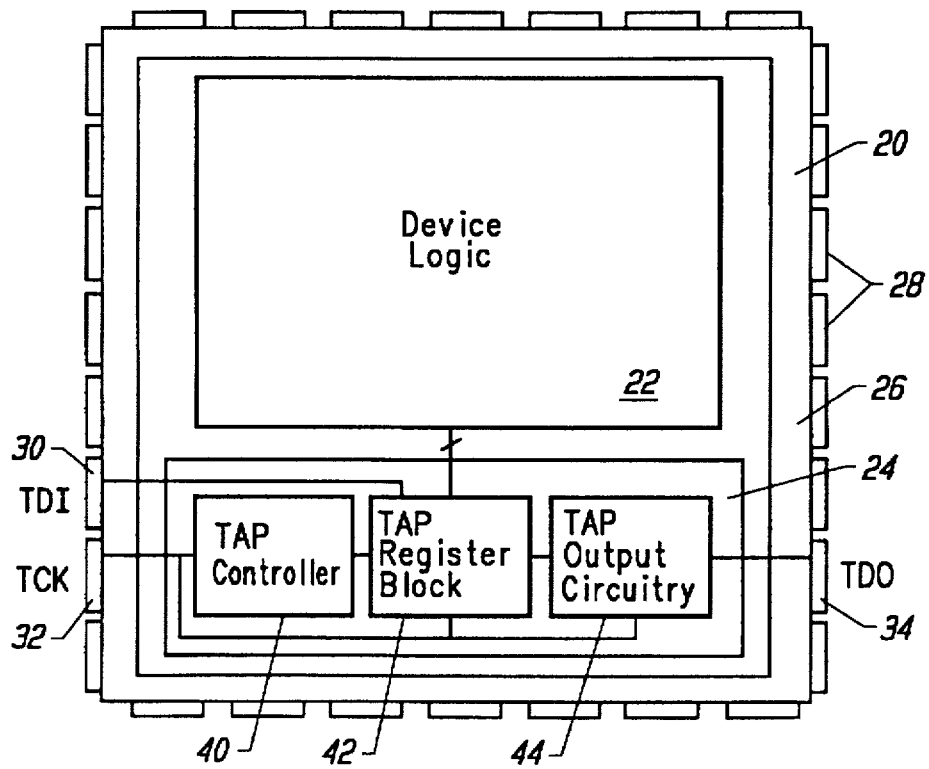
FIG. 1 illustrates an integrated circuit incorporating JTAG circuitry.
Figure 2:
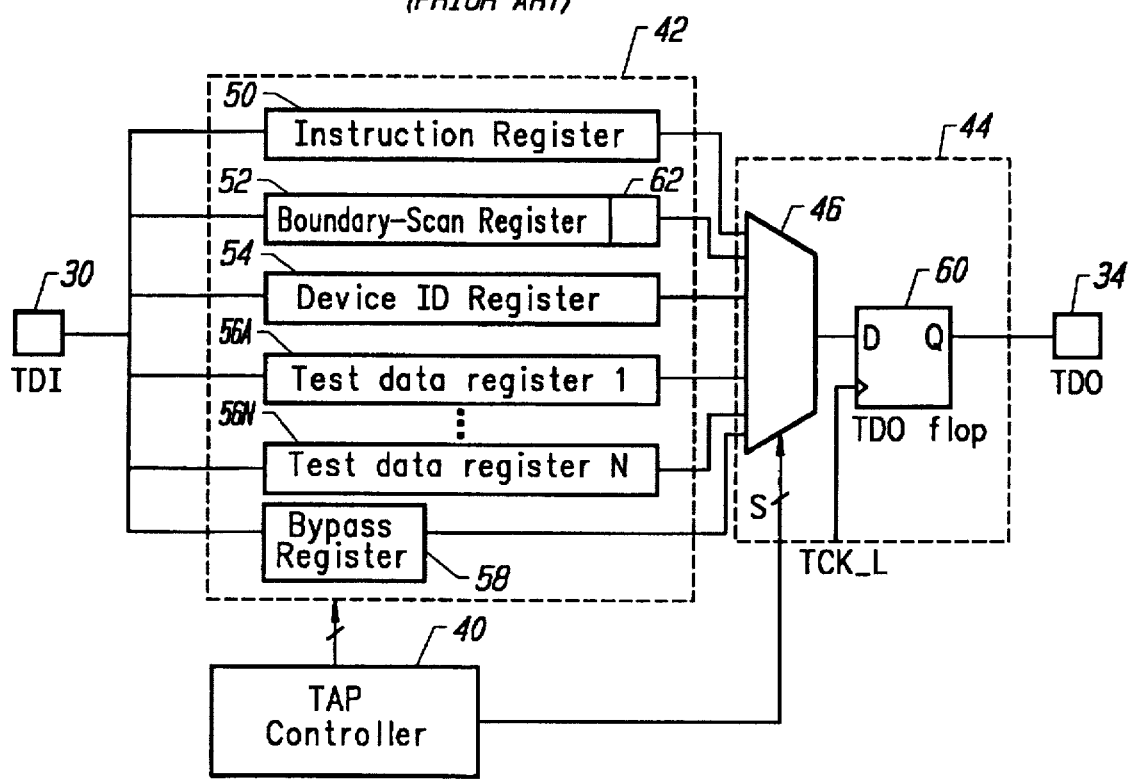
FIG. 2 is a more detailed illustration of the JTAG circuitry of FIG. 1.
Figure 4:
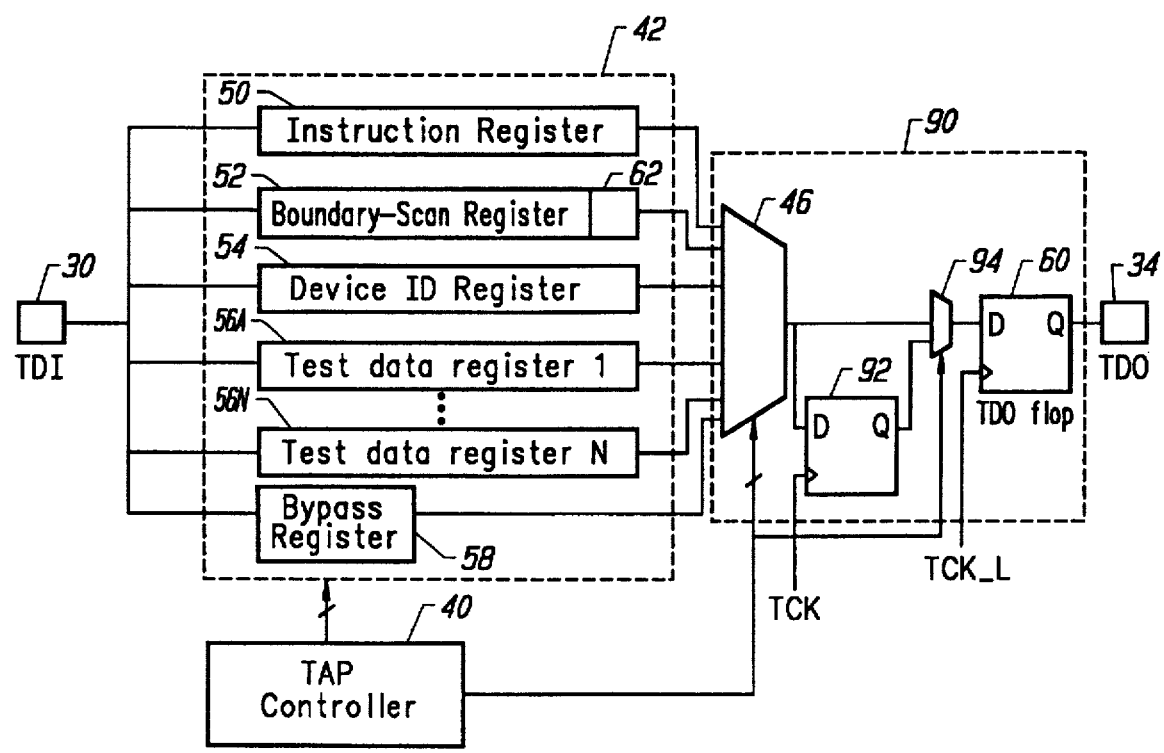
FIG. 4 illustrates a TAP output circuit in accordance with one embodiment of the invention.

FIG. 4 illustrates an output circuit 90 in accordance with one embodiment of the invention. The output circuit 90 adds two critical elements to the output circuit 44 of FIG. 2. First, an additional switching element 92 is inserted into the path of the output multiplexer 46. This additional switching element 92, sometimes referred to as a cycle-insertion switching element, eliminates the problem of the half-cycle path delay from the output multiplexer 46 to the output switching element (TDO flop) 60.

The cycle-insertion switching element 92 is activated on the same clock signal transition (e.g., a low to high transition) as the terminal switching component 62 that generates the output signal which it receives. Thus, an output signal from a register of the register block 42 has an entire signal cycle to pass through the output multiplexer 46. While it may be difficult to traverse this path in a half-cycle, as shown in reference to FIG. 3, the invention's provision of a full signal cycle is easily satisfied, even at extremely high clock speeds and for very large output multiplexers 46.

When the cycle-insertion switching element 92 is activated during a second signal cycle, the output signal subsequently passes to the output switching element 60. At this point, the output signal easily reaches the output switching element 60 within half a signal cycle because it only needs to pass through a single two-to-one multiplexer 94. Since this element 94 has a relatively shorter path length compared to the tree of multiplexers associated with the output multiplexer 46, it is referred to as a fast-path multiplexer. The output switching element 60 can easily latch the output signal at the second signal transition of the second clock cycle. Note that the output signal is latched on the signal transition that is opposite to the signal transition that activated the signal from the terminal switching component 62. For example, if the JTAG standard is being observed, the terminal switching component 62 is latched on the positive signal transition, while the output switching element 60 is latched on the negative signal transition.

Although the invention requires an extra cycle to drive the output signal to the output pin 34, a substantially faster clock speed can be used because the half-cycle delay condition for the output signal through the output multiplexer 46 is eliminated. Consequently, higher speed shifting of test data is achieved with the present invention.

The fast-path multiplexer 94 can be used to directly receive output from the output multiplexer 46. Simple modifications can be made to the TAP controller 40 to enable the control signal used to select this option. This option will typically be selected at lower clock speeds. That is, at lower clock speeds, the output circuit 90 can operate in a traditional manner by routing signals directly from the output multiplexer 46 to the output switching element 60. For example, certain registers are not used for directly applying or receiving test data from logic on the device. These registers include registers such as the instruction register 50, the bypass register 58, and the device identification register 54. For these registers, it is not important for data to be shifted at high functional frequencies. Hence, the half-cycle timing requirement does not pose a constraint. In this context, the additional path delay created by the extra multiplexer 94 is not critical. The path through the cycle-insertion switching element 92 is used for shift registers such as the test data registers 56 and the boundary scan register 52. The control signal to switch between these two options is derived from the TAP controller 40.

Figure 3:
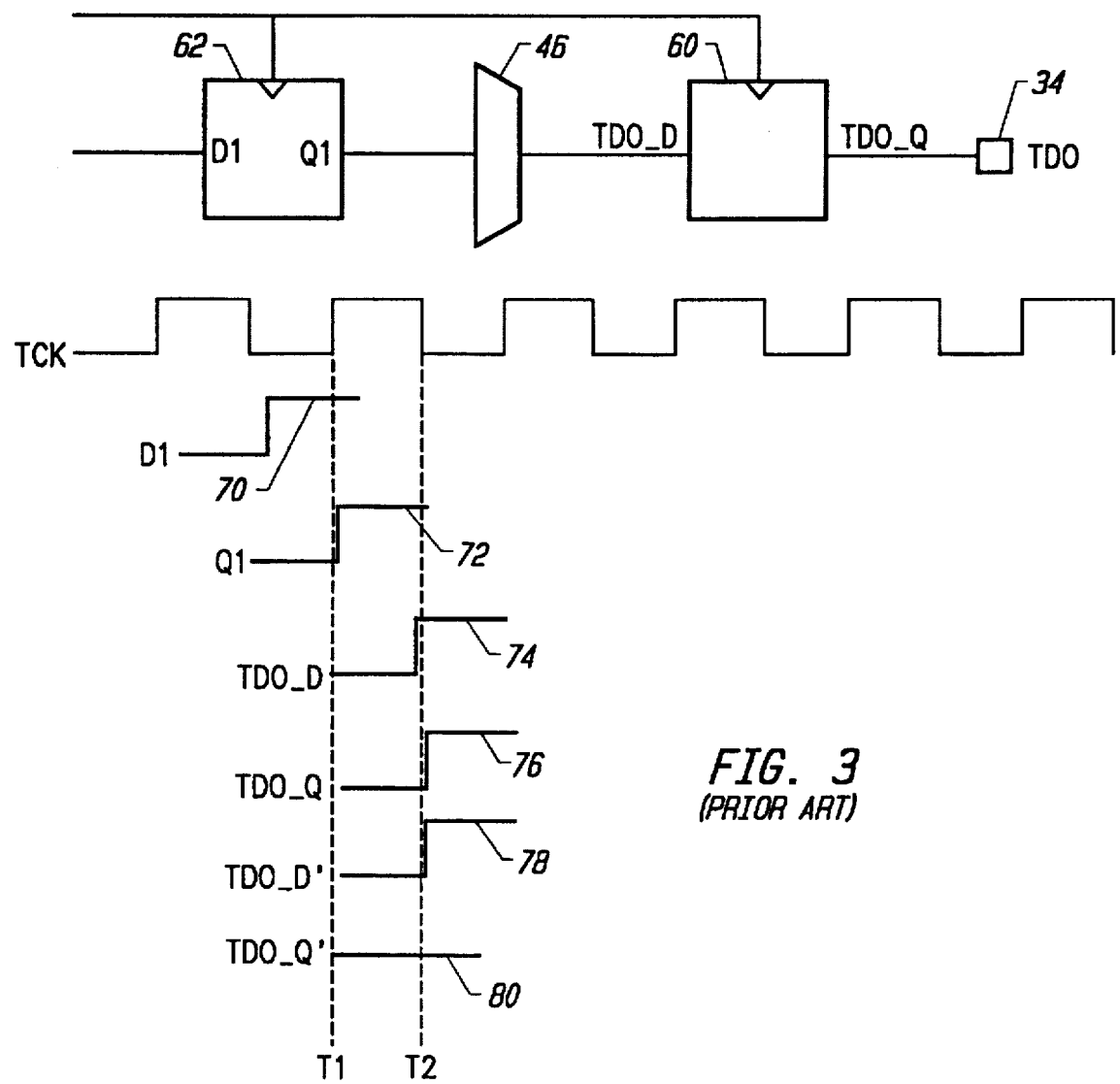
FIG. 3 shows a set of waveforms used to illustrate prior art limitations on high speed testing of integrated circuits.
Figure 5:
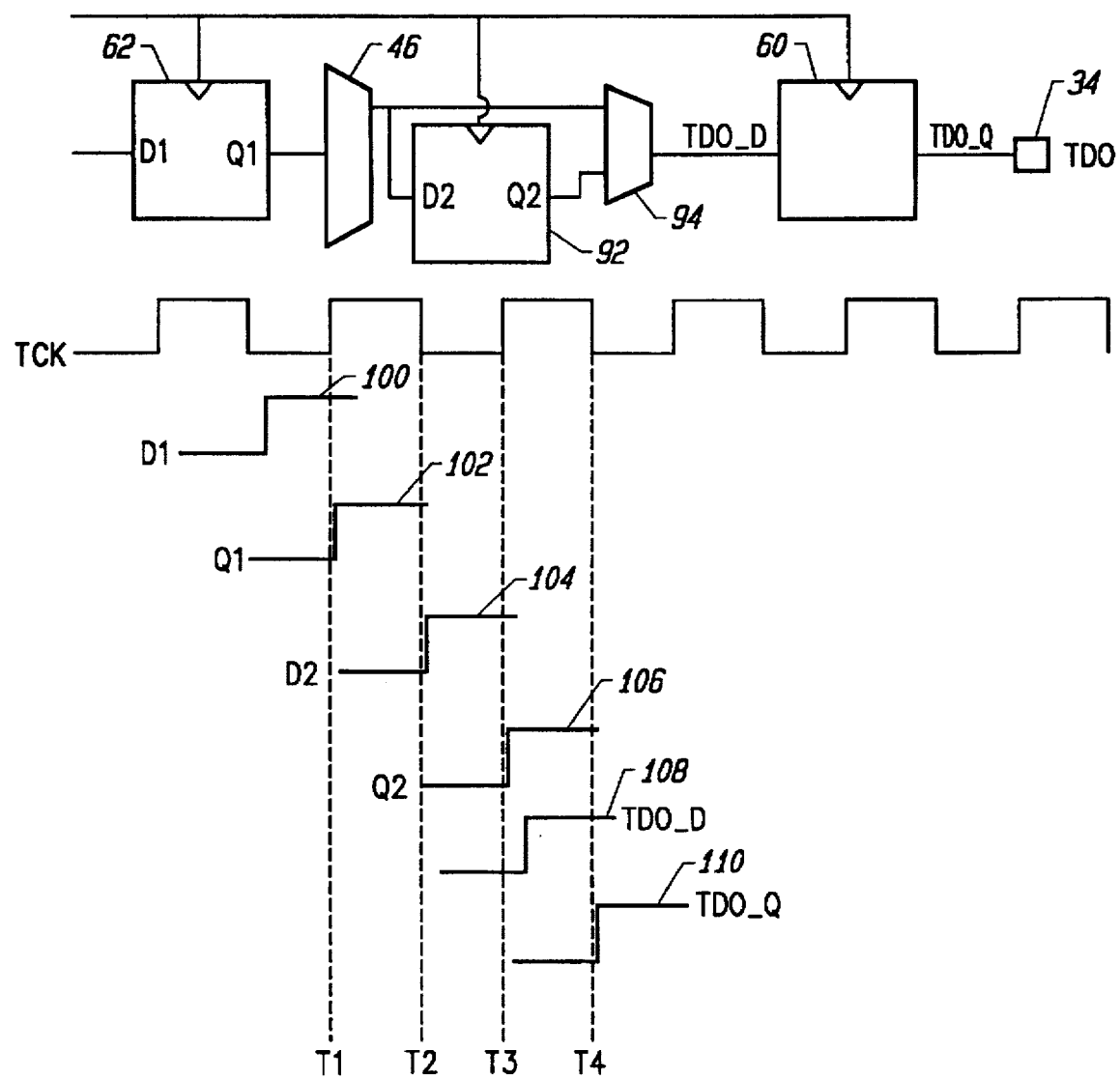
FIG. 5 shows a set of waveforms used to illustrate the benefits associated with the present invention.

The operation of the invention is more fully appreciated with reference to FIG. 5. The top of FIG. 5 illustrates the output signal path shown in FIG. 4. The figure also includes a set of timing diagrams. Waveform 100 illustrates the D1 node of the terminal switching component 62 experiencing a low to high signal transition. The high signal is released at its output node (Q1) during the next positive clock cycle, denominated time T1. This operation is shown with waveform 102. Waveform 104 illustrates that the low to high signal transition reaches the input node (D2) of the cycle-insertion switching element 92 after a half-cycle of the clock, indicated at time T2. In the prior art, as shown in FIG. 3, this could result in an erroneous output signal being applied to the output pin 34. However, in accordance with the invention, the signal is not released at the output node (Q2) until a complete signal cycle is reached, as indicated by time T3. That is, the low to high signal transition shown in waveform 102 at time T1 has until time T3 to be released at the output node (Q2) of switching element 92, as shown by waveform 106.

Waveform 108 illustrates the input node (TDO_D) of the output switching element 60 receiving the output signal after a small path delay caused by the extra multiplexer 94. As indicated above, even at extremely high switching frequencies, this small path delay will not prevent the signal from reaching the output switching element 60 within a half-cycle of the clock. Consequently, the output node (TDO_Q) of the output switching element 60 can be easily driven by the second signal transition of the clock cycle beginning at time T3. This is shown at waveform 110.

Figure 6:
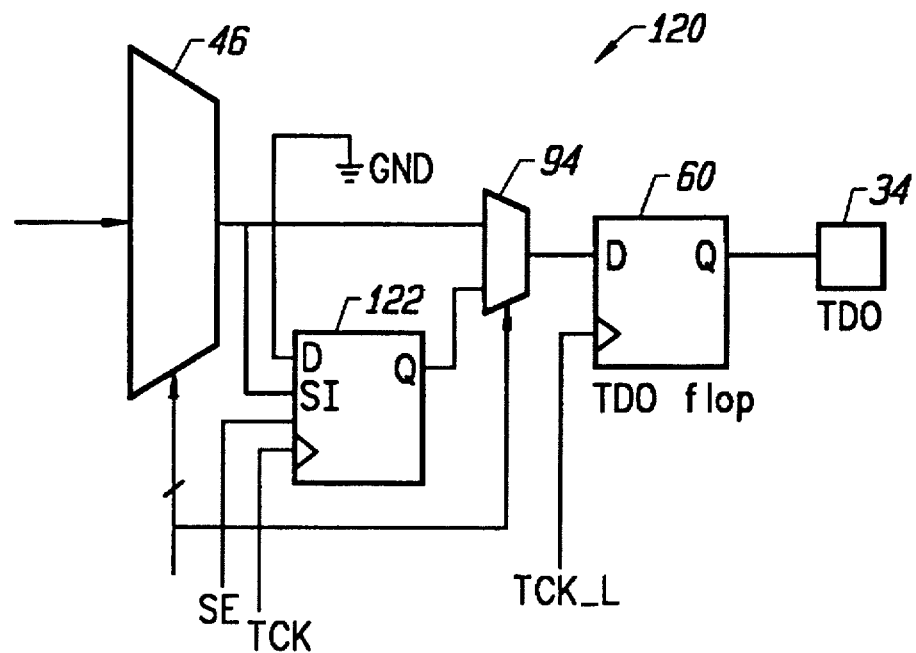
FIG. 6 illustrates a TAP output circuit in accordance with an alternate embodiment of the invention.

FIG. 6 illustrates an alternate TAP output circuit 120 in accordance with the invention. The circuit operates in a manner consistent with the circuit of FIG. 4. However, in the circuit of FIG. 6, the cycle-insertion switching element 122 includes a number of additional input nodes. As shown in the figure, the "D" input node is tied to ground. The switching element receives its input signals at a scan input node (SI). The scan input node is activated in response to a scan enable signal received on a scan enable node (SE). This embodiment of the invention provides greater control as to when data is shifted through the switching element 122. In addition, a low value is latched into the "D" node whenever the clock is active, and scan enable is inactive. This prevents extraneous values from getting latched into the switching element 122 when it is not used as part of any shift register. In addition, since the "D" input node is tied to ground, it is in a low power mode. The scan enable signal may be generated by the TAP controller 40.

Figure 7:
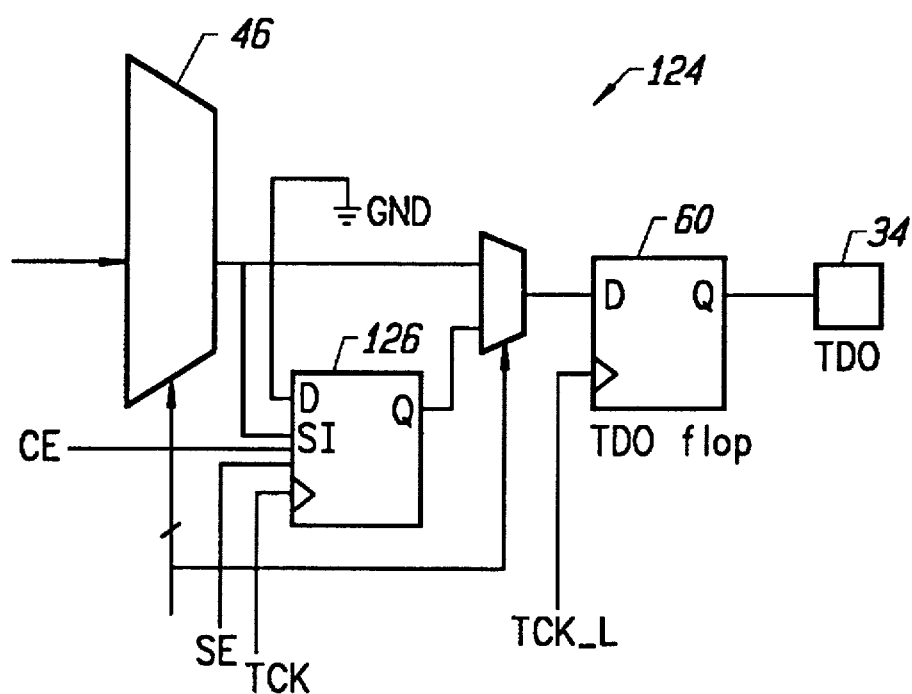
FIG. 7 illustrates a TAP output circuit in accordance with another alternate embodiment of the invention.

FIG. 7 illustrates another output circuit in accordance with the invention. This embodiment generally corresponds with the embodiment of FIG. 6. However, it includes a cycle-insertion switching element 126 with a clock enable (CE) node. Signals are only processed by the switching element 126 when a clock enable signal is applied to the clock enable node and when a select enable signal is applied to the select enable node. These signals are generated by the TAP controller 40. By disabling the clock enable, the switching element 126 will not latch data through its "D" input. As a result, it will not be clocking in data whenever TCK is active, reducing the power dissipation when it is not used in shifting data as part of one or more shift registers.

Those skilled in the art will recognize that the invention is applicable for device testing or board level testing. The invention has been described in reference to master-slave positive edge-triggered flip-flops. Naturally, other implementations of storage elements can be used and the particular signal transition sequence is not critical.

Those skilled in the art will appreciate that the technique of the invention facilitates high speed testing of integrated circuits. Thus, the invention provides improved test data rates, lower test application times, and overall increased testing efficiency. The technique of the invention achieves these benefits while remaining fully compliant with JTAG standards, and otherwise being readily adaptable to other standards.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

I claim:

1. A circuit to facilitate high speed shifting of test data through an integrated circuit, comprising:

a register with a terminal switching component generating an output signal in response to a first defined signal transition of a first clock cycle;

an output multiplexer connected to said register, said output multiplexer passing said output signal to an output multiplexer output node;

a cycle-insertion switching element connected to said output multiplexer output node, said cycle-insertion switching element receiving said output signal at a cycle-insertion switching element input node and passing it to a cycle-insertion switching element output node in response to a first defined signal transition of a second clock cycle; and an output switching element to apply said output signal to an output pin in response to a second defined signal transition of said second clock cycle.

2. The apparatus of claim 1 further comprising:

a fast-path multiplexer with a first input node connected to said output multiplexer output node, a second input node connected to said cycle-insertion switching element output node, and a fast-path multiplexer output node connected to said output switching element, said fast-path multiplexer establishing a connection between said output multiplexer output node and said output switching element during a first clock rate, and a connection between said cycle-insertion switching element output node and said output switching element during a second clock rate higher than said first clock rate.

3. The apparatus of claim 2 wherein said cycle-insertion switching element is a master-slave flip-flop.

4. The apparatus of claim 3 wherein said master-slave flip-flop includes a scan input node connected to said output multiplexer output node and a select enable node to enable the receipt of said output signal from said output multiplexer output node.

5. The apparatus of claim 4 wherein said master-slave flip-flop further includes a clock enable node.

6. In a Joint Test Access Group (JTAG) standard testing circuit including a register with a terminal switching component generating an output signal in response to a positive signal transition of a first clock cycle, an output multiplexer connected to said register, said output multiplexer passing said output signal to an output multiplexer output node, and an output switching element connected to said output multiplexer output node to receive said output signal and pass it to an output pin on a negative clock signal transition, the improvement comprising:

a cycle-insertion switching element connected between said output multiplexer output node and said output switching element, said cycle insertion switching element receiving said output signal at a cycle-insertion switching element input node and passing it to a cycle-insertion switching element output node in response to a positive signal transition of a second clock cycle, such that said output switching element receives said output signal before the negative signal transition of said second clock cycle.

7. The apparatus of claim 6 further comprising:

a fast-path multiplexer with a first input node connected to said output multiplexer output node, a second input node connected to said cycle-insertion switching element output node, and a fast-path multiplexer output node connected to said out switching element, said fast-path multiplexer establishing a connection between said output multiplexer output node and said output switching element during a first clock rate, and a connection between said cycle-insertion switching element output node and said output switching element during a second clock rate higher than said first clock rate.

8. The apparatus of claim 6 wherein said cycle-insertion switching element is a master-slave flip-flop.

9. The apparatus of claim 8 wherein said master-slave flip-flop includes a scan input node connected to said output multiplexer output node and a select enable node to enable the receipt of said output signal from said output multiplexer output node.

10. The apparatus of claim 9 wherein said master-slave flip-flop further includes a clock enable node.

11. A method of constructing a circuit that facilitates high speed shifting of test data through an integrated circuit, said method comprising the steps of:

providing a register with a terminal switching component generating an output signal in response to a first defined signal transition of a first clock cycle;

providing an output multiplexer connected to said register, said output multiplexer passing said output signal to an output multiplexer output node;

providing a cycle-insertion switching element connected to said output multiplexer output node, said cycle-insertion switching element receiving said output signal at a cycle-insertion switching element input node and passing it to a cycle-insertion switching element output node in response to a first defined signal transition of a second clock cycle; and providing an output switching element to apply said output signal to an output pin in response to a second defined signal transition of said second clock cycle.

12. The method of claim 11 further comprising the step of:

providing a fast-path multiplexer with a first input node connected to said output multiplexer output node, a second input node connected to said cycle-insertion switching element output node, and a cycle-insertion multiplexer output node connected to said output switching element, said fast-path multiplexer establishing a connection between said output multiplexer output node and said output switching element during a first clock rate, and a connection between said cycle-insertion switching element output node and said output switching element during a second clock rate higher than said first clock rate.

13. The method of claim 12 further comprising the step of providing a cycle-insertion switching element with a master-slave flip-flop.

14. The method of claim 13 further comprising the step of providing said master-slave flip-flop with a scan input node connected to said output multiplexer output node and a scan enable node to enable the receipt of said output signal from said output multiplexer output node.

15. The method of claim 14 further comprising the step of providing said master-slave flip-flop with a clock enable node.

16. A method of high speed shifting of test data through an integrated circuit in response to a clock signal wherein each cycle of said clock signal has a first signal transition and a second signal transition, said shifting operation being performed in accordance with a standard that requires an output signal to be applied to an output pin on said second signal transition, said method comprising the steps of:

generating an output signal in response to a first signal transition of a first clock cycle;

receiving said output signal at a cycle-insertion switching element input node and passing it to a cycle-insertion switching element output node in response to a first transition of a second clock cycle; and passing said output signal from an output switching element to said output pin during a second transition of said second signal cycle.

17. The method of claim 16 wherein said high speed shifting of test data is performed in accordance with the Joint Test Access Group (JTAG) standard.

18. The method of claim 16 wherein said generating step is performed in response to a positive signal transition corresponding to said first signal transition.

19. The method of claim 16 further comprising the step of routing said output signal through a multiplexer before said passing step.

* * * * *